United States Patent
Liu et al.

(10) Patent No.: US 10,971,530 B2
(45) Date of Patent: Apr. 6, 2021

(54) MANUFACTURING METHOD FOR A TFT ARRAY SUBSTRATE AND TFT ARRAY SUBSTRATE

(71) Applicant: Wuhan China Star Optoelectronics Technology Co., Ltd., Wuhan (CN)

(72) Inventors: Guanghui Liu, Wuhan (CN); Peng He, Wuhan (CN); Yong Xu, Wuhan (CN); Fei Ai, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 110 days.

(21) Appl. No.: 16/097,279

(22) PCT Filed: Sep. 18, 2018

(86) PCT No.: PCT/CN2018/106327
§ 371 (c)(1),
(2) Date: Oct. 29, 2018

(87) PCT Pub. No.: WO2019/200834
PCT Pub. Date: Oct. 24, 2019

(65) Prior Publication Data
US 2019/0326335 A1    Oct. 24, 2019

(30) Foreign Application Priority Data

Apr. 20, 2018    (CN) .......................... 201810362822.2

(51) Int. Cl.
*H01L 27/12* (2006.01)

(52) U.S. Cl.
CPC ........ *H01L 27/1288* (2013.01); *H01L 27/127* (2013.01); *H01L 27/1222* (2013.01)

(58) Field of Classification Search
None
See application file for complete search history.

(56) References Cited

U.S. PATENT DOCUMENTS

| 8,017,459 B2 * | 9/2011 | Yang ................... H01L 27/1214 438/149 |
| 8,551,822 B2 * | 10/2013 | Tung ................... H01L 27/1288 438/149 |

(Continued)

FOREIGN PATENT DOCUMENTS

| CN | 101009249 A | 8/2007 |
| CN | 102751240 A | 10/2012 |
| CN | 103199060 A | 7/2013 |

*Primary Examiner* — David E Graybill
(74) *Attorney, Agent, or Firm* — Leong C. Lei

(57) ABSTRACT

A manufacturing method for TFT array substrate and TFT array substrate are disclosed. After depositing an electrode material layer and a metal material layer on the gate insulation layer and the active layer in sequence after the active layer above the gate electrode is formed. A photoresist pattern is formed on the metal material layer. The photoresist pattern includes a first and second photoresist blocks with different thicknesses. The metal material layer and the electrode material layer are etched using the photoresist pattern to form a contact electrode and pixel electrodes connected with two ends of the active layer and the source/drain electrodes on the contact electrode. The process is simple and can effectively reduce the contact resistance between the source/drain and the active layer and improve the quality of the product.

9 Claims, 9 Drawing Sheets

(56) References Cited

U.S. PATENT DOCUMENTS

| | | | |
|---|---|---|---|
| 8,586,990 B2* | 11/2013 | Yang | H01L 27/1248 |
| | | | 257/72 |
| 9,583,508 B2* | 2/2017 | Jiang | H01L 21/32133 |
| 2007/0166628 A1* | 7/2007 | Jung | G03F 1/50 |
| | | | 430/5 |
| 2007/0295967 A1* | 12/2007 | Harada | H01L 27/124 |
| | | | 257/72 |
| 2008/0042132 A1* | 2/2008 | Shih | H01L 27/124 |
| | | | 257/59 |
| 2008/0199788 A1 | 8/2008 | Park | |
| 2008/0213949 A1* | 9/2008 | Tung | H01L 27/1214 |
| | | | 438/155 |
| 2009/0191652 A1* | 7/2009 | Fang | H01L 27/124 |
| | | | 438/29 |
| 2010/0163862 A1* | 7/2010 | Yang | H01L 27/1214 |
| | | | 257/43 |
| 2011/0297931 A1* | 12/2011 | Yang | H01L 27/1248 |
| | | | 257/43 |
| 2015/0236053 A1* | 8/2015 | Jiang | H01L 27/1222 |
| | | | 257/72 |
| 2017/0293384 A1* | 10/2017 | Ryu | H01L 29/66757 |
| 2019/0326335 A1* | 10/2019 | Liu | H01L 29/41733 |

* cited by examiner

MANUFACTURING METHOD FOR A TFT ARRAY SUBSTRATE AND TFT ARRAY SUBSTRATE

FIELD OF THE INVENTION

The present invention relates to a display technology field, and more particularly to manufacturing method for a TFT array substrate and TFT array substrate.

BACKGROUND OF THE INVENTION

In the display technology field, the flat panel display device such as liquid crystal display device (LCD) has gradually replaced the cathode ray tube (CRT) display device. The liquid crystal display device has many advantages such as a thin body, power saving, and no radiation, and has been widely used.

Most of the liquid crystal display devices in the current market are backlight type liquid crystal display devices, which include a liquid crystal display panel and a backlight module. Generally, the liquid crystal display panel includes a color filter (CF) substrate, a thin film transistor (TFT) array substrate, a liquid crystal (LC) sandwiched between the color filter substrate and the thin film transistor array substrate, and a sealant. The working principle of the liquid crystal display panel is to place liquid crystal molecules in two parallel glass substrates. There are many vertical and horizontal fine wires in the middle of the two glass substrates, and the liquid crystal molecules are controlled to change direction by applying a voltage or not to refract the light emitted from backlight module light is changed in order to generate a picture.

In a conventional TFT array substrate of a liquid crystal display device, an amorphous silicon (a-Si) material or a Low Temperature Poly-silicon (LTPS) material is often used for the material of the active layer of the TFT device. Comparing to a TFT array substrate made of a low-temperature poly-silicon material, a TFT array substrate made of an amorphous silicon material has low resolution and high power consumption. However, the TFT array substrate made of an amorphous silicon material has a short production cycle, and thus the TFT array substrate made of amorphous silicon material and the TFT array substrate made of a low-temperature poly-silicon material all have a certain market share in the existing market.

In a TFT array substrate made of amorphous silicon material, a gate electrode is generally formed on a base substrate, and a gate insulating layer and an amorphous silicon layer are formed on the gate electrode. Then, respectively disposing a source electrode and a drain electrode connected with both ends of the amorphous silicon layer. The above TFT array substrate structure has a relatively large contact resistance among the amorphous silicon layer and the source and drain since the source and drain direct contact with the amorphous silicon layer, which affect the quality of the product.

SUMMARY OF THE INVENTION

An object of the present invention is to provide a manufacturing method for a TFT array substrate, which can reduce the contact resistance between a source/drain electrode and an active layer and improve the quality of a product.

Another object of the present invention is to provide a TFT array substrate capable of reducing the contact resistance between a source/drain and an active layer, and has high product quality.

In order to achieve the above purpose, a manufacturing method for a TFT array substrate, comprising steps of: step S1, providing a substrate, forming a gate electrode and a gate insulation layer covering the gate electrode on the substrate; step S2, forming an active layer on the gate insulation layer; step S3, sequentially depositing an electrode material layer and a metal material layer on the gate insulation layer and the active layer; forming a photoresist pattern on the metal material layer, wherein, the photoresist pattern includes a first photoresist block and a second photoresist block which are separately; a projection of a portion of the first photoresist block in a vertical direction is overlapped with one end of the active layer, and a projection of a portion of the second photoresist block in the vertical direction is overlapped with the other end of the active layer; a thickness of the first photoresist block is greater than a thickness of the second photoresist block; and step S4, etching the metal material layer and the electrode material layer using the photoresist pattern as a mask to remove a portion of the metal material layer and the electrode material layer that are not covered by the photoresist pattern; ashing the photoresist pattern to remove the second photoresist block; etching the metal material layer using the photoresist pattern being ashed as a mask to remove a portion of the metal material layer that are not covered by the photoresist pattern being ashed in order to form a contact electrode and a pixel electrode respectively connected with two ends of the active layer and a source/drain electrode located on the contact electrode.

Wherein the step S4 further includes a step of removing the photoresist pattern being ashed.

Wherein the method further comprises a step S5, depositing a passivation layer on the gate insulation layer, the active layer, the pixel electrode, and the source/drain electrode; forming the common electrode 90 on the passivation layer.

Wherein a specific process of forming the gate electrode on the substrate is: depositing a gate metal layer on the substrate, performing an exposure and development process on the gate metal layer in order to form the gate electrode; wherein the step S2 comprises: step S21, depositing an amorphous silicon material on the gate insulation layer, and performing an exposure and development process to the amorphous silicon material to form an amorphous silicon island; step S22, performing an ion doping to the amorphous silicon island to form the active layer, wherein the active layer includes an amorphous silicon material layer and a doped amorphous silicon layer located on the amorphous silicon material layer; step S3, a specific process of forming the photoresist pattern on the metal material layer is: forming a photoresist material layer on the metal material layer, and patterning the photoresist material layer using a halftone mask in order to obtain the photoresist pattern.

Wherein in the step S4, when etching the metal material layer and the electrode material layer using the photoresist pattern as a mask in order to remove the metal material layer and the electrode material layer which are not blocked by the photoresist pattern, at the same time, removing a portion of the doped amorphous silicon layer not covered by the photoresist pattern in order to form the first contact layer and the second contact layer respectively located on two ends of the amorphous silicon material layer, wherein the contact electrode is connected to the first contact layer, and the pixel electrode is connected to the second contact layer.

Wherein in the step S4, dry etching the metal material layer using the photoresist pattern as a mask to remove the portion of the metal material layer not covered by the photoresist pattern, and then wet etching the electrode material layer and the doped amorphous silicon layer using the photoresist pattern as a mask to remove a portion of the electrode material layer and the doped amorphous silicon layer that are not covered by the photoresist pattern; dry etching the metal material layer using the photoresist pattern being ashed as a mask to remove a portion of the metal material layer not covered by the photoresist pattern being ashed.

Wherein a material of the gate electrode is molybdenum (Mo), a material of the gate insulation layer is silicon nitride (SiNx) and a material of the electrode material layer is indium tin oxide (ITO).

Wherein in the step S22, performing an N-type ion doping to the amorphous silicon island.

Wherein in the step S22, performing an N-type ion doping to the amorphous silicon island using phosphorus ions.

The present invention also provides a TFT array substrate, comprising a substrate, a gate electrode disposed on the substrate, a gate insulation layer disposed on the substrate and the gate electrode, an active layer disposed on the gate insulation layer and above the gate electrode, and a contact electrode and a pixel electrode respectively connected with two terminals of the active layer, and a source/drain electrode located on the contact electrode.

The beneficial effect of the present invention: the TFT array substrate manufacturing method of the present invention deposits an electrode material layer and a metal material layer on the gate insulation layer and the active layer in sequence after the active layer above the gate electrode is formed. A photoresist pattern is formed on the metal material layer. The photoresist pattern includes a first and second photoresist blocks with different thicknesses. The metal material layer and the electrode material layer are etched using the photoresist pattern to form a contact electrode and pixel electrodes connected with the two ends of the active layer and the source/drain electrodes on the contact electrode. The process is simple and can effectively reduce the contact resistance between the source/drain and the active layer and improve the quality of the product. The TFT array substrate of the present invention can reduce the contact resistance between the source/drain and the active layer, and has high product quality.

BRIEF DESCRIPTION OF THE DRAWINGS

For a further understanding of the features and technical content of the present invention, referring to the following detailed description of the invention and the accompanying drawings. However, the drawings are provided for reference and description only, and are not intended to limit the present invention.

In the drawings.

DETAILED DESCRIPTION OF PREFERRED EMBODIMENTS

In order to further illustrate the technical measures taken by the present invention and their effects, the following detailed description is made in conjunction with the preferred embodiments of the present invention and the accompanying drawings.

Figure 1:
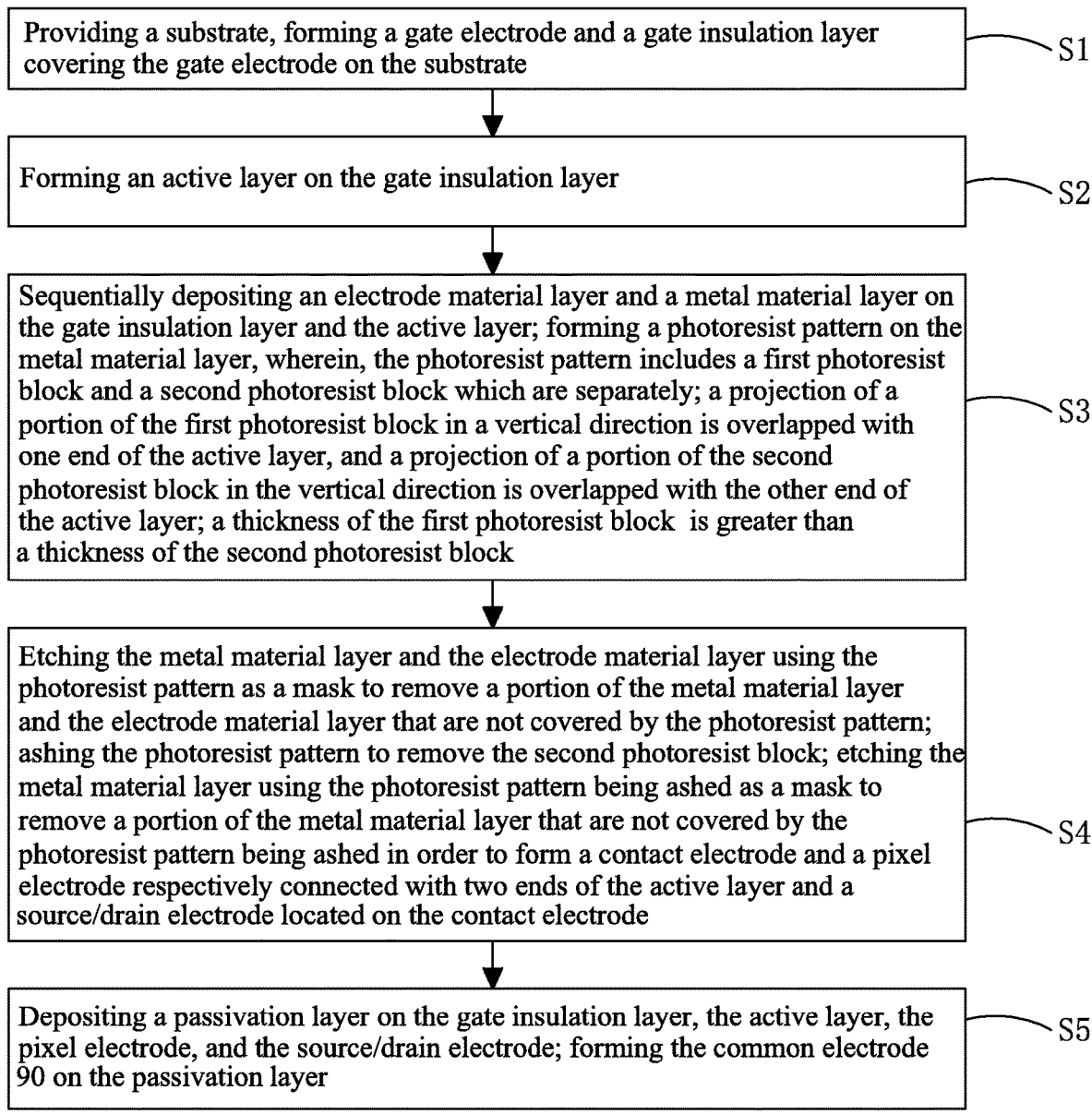
FIG. 1 is a flowchart of a manufacturing method for a TFT array substrate according to the present invention.
Figure 2:
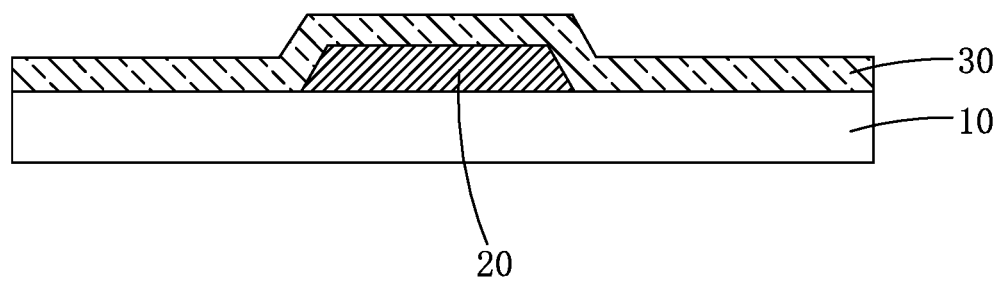
FIG. 2 is a schematic diagram of a step S1 of the manufacturing method for a TFT array substrate of the present invention.

With reference to FIG. 1, the present invention provides a manufacturing method for a TFT array substrate, comprising the following steps:

Step S1, referring to FIG. 2, providing a substrate 10, forming a gate electrode 20 and a gate insulation layer 30 covering the gate electrode 20 on the substrate 10.

Specifically, in the step S1, a specific process of forming the gate electrode 20 on the substrate 10 is: depositing a gate metal layer on the substrate 10, performing an exposure and development process on the gate metal layer in order to form the gate electrode 20.

Specifically, a material of the gate electrode 20 is molybdenum (Mo).

Specifically, a material of the gate insulation layer 30 is silicon nitride (SiNx).

Figure 4:
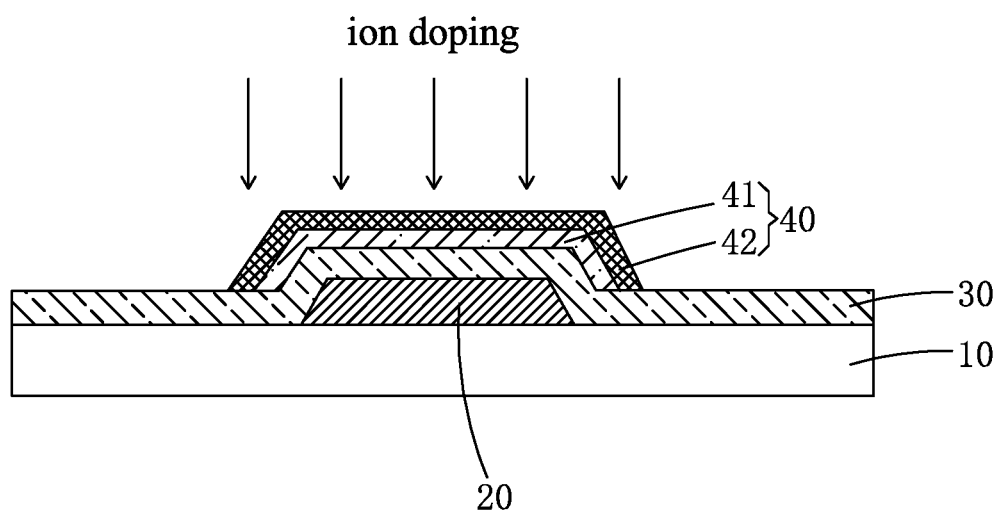

Step S2, with reference to FIG. 4, forming an active layer 40 on the gate insulation layer 30.

Figure 3:
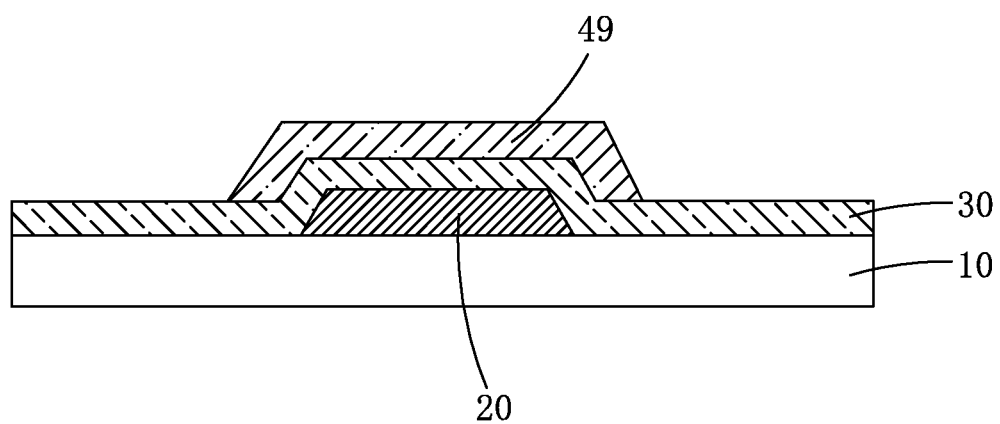
FIG. 3 and FIG. 4 are schematic diagrams of a step S2 of the manufacturing method for a TFT array substrate of the present invention.

Specifically, the step S2 includes:

a step S21, referring to FIG. 3, depositing an amorphous silicon material on the gate insulation layer 30, and performing an exposure and development process to the amorphous silicon material to form an amorphous silicon island 49.

In step S22, referring to FIG. 4, performing an ion doping to the amorphous silicon island 49 to form the active layer 40. The active layer 40 includes an amorphous silicon material layer 41 and a doped amorphous silicon layer 42 located on the amorphous silicon material layer 41.

Specifically, in step S22, performing an N-type ion doping to the amorphous silicon island 49.

Preferably, in the step S22, performing an N-type ion doping to the amorphous silicon island 49 using phosphorus ions.

Figure 5:
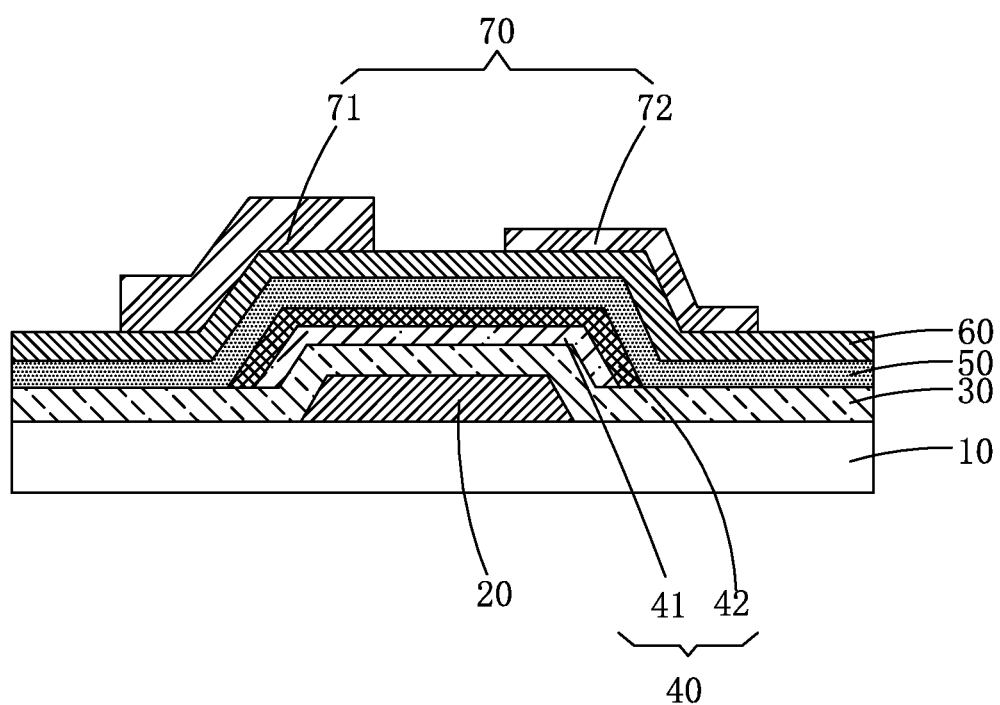
FIG. 5 is a schematic diagram of a step S3 of a manufacturing method for a TFT array substrate of the present invention.

In step S3, referring to FIG. 5, sequentially depositing an electrode material layer 50 and a metal material layer 60 on the gate insulation layer 30 and the active layer 40. Forming a photoresist pattern 70 on the metal material layer 60. Wherein, the photoresist pattern 70 includes a first photoresist block 71 and a second photoresist block 72 which are separately. A projection of a portion of the first photoresist block 71 in a vertical direction is overlapped with one end of the active layer 40, and a projection of a portion of the second photoresist block 72 in the vertical direction is overlapped with the other end of the active layer 40. A thickness of the first photoresist block 71 is greater than a thickness of the second photoresist block 72.

Specifically, a material of the electrode material layer 50 is preferably indium tin oxide (ITO).

In step S3, a specific process of forming the photoresist pattern 70 on the metal material layer 60 is: forming a photoresist material layer on the metal material layer 60, and patterning the photoresist material layer using a halftone mask (HTM) in order to obtain the photoresist pattern 70.

Figure 6:
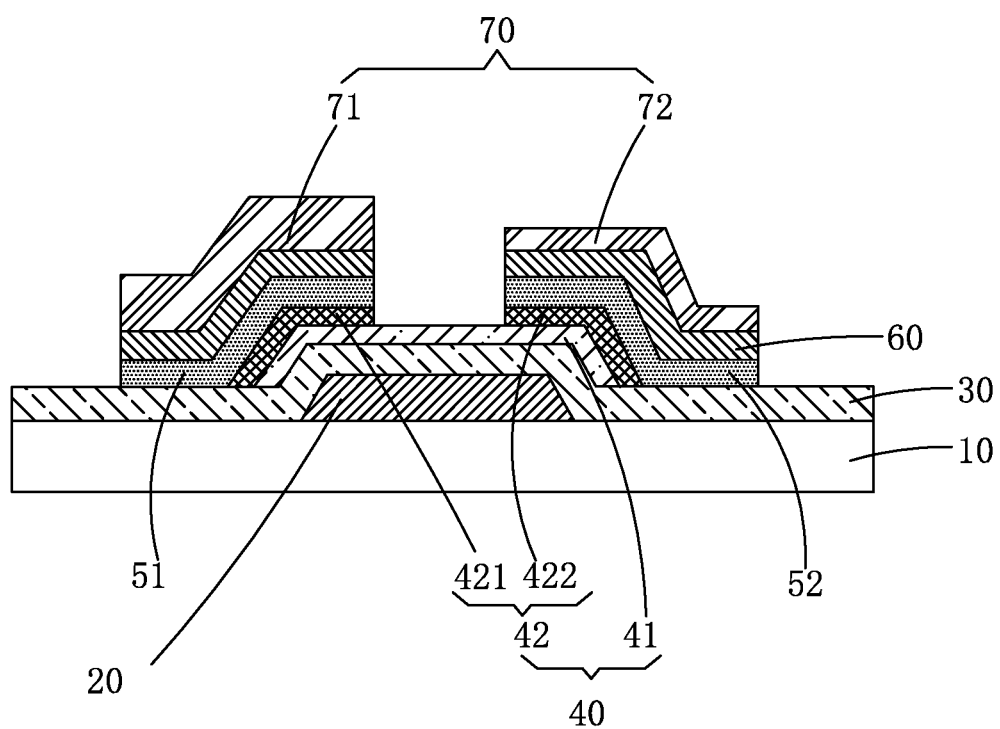
FIG. 6 to FIG. 8 are schematic diagrams of a step S4 of the manufacturing method for a TFT array substrate of the present invention.
Figure 7:
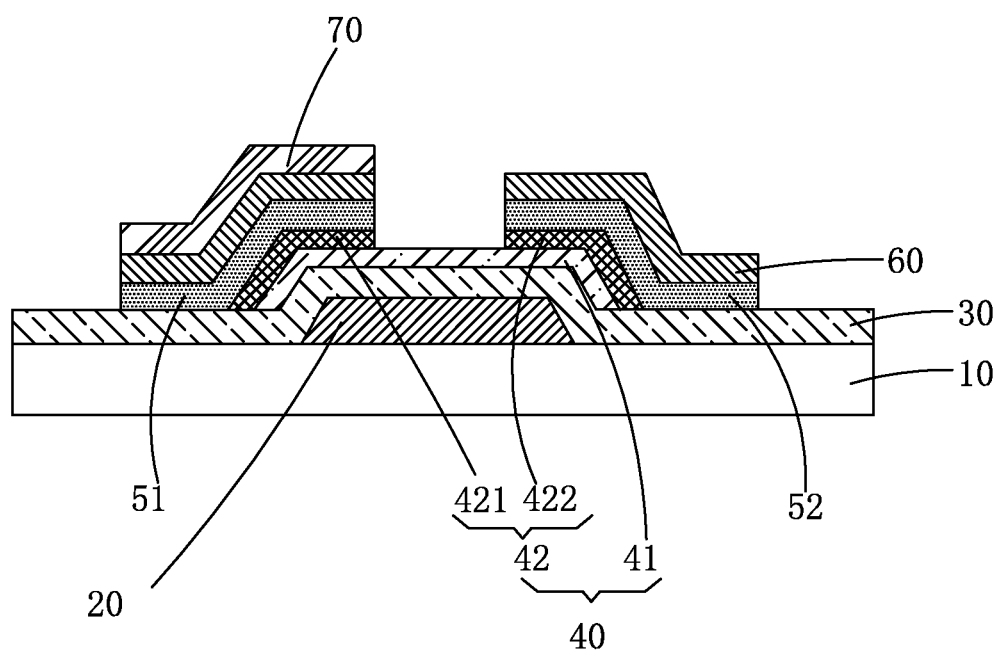
Figure 8:
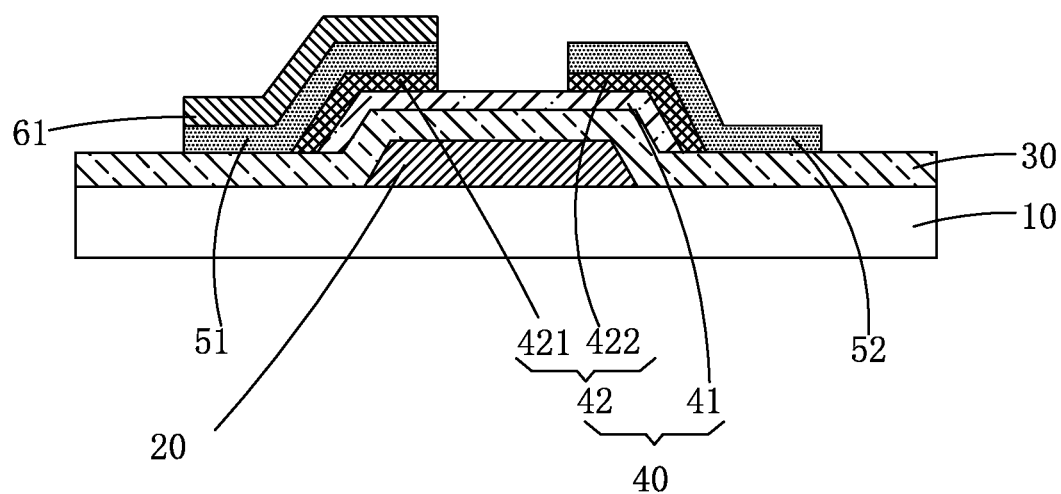

In step S4, referring to FIG. 6, etching the metal material layer 60 and the electrode material layer 50 using the photoresist pattern 70 as a mask to remove a portion of the metal material layer 60 and the electrode material layer 50 that are not covered by the photoresist pattern 70. Referring to FIG. 7, ashing the photoresist pattern 70 to remove the second photoresist block 72 and thinning the thickness of the first photoresist block 71 at the same time. Referring to FIG. 8, etching the metal material layer 60 using the photoresist pattern 70 being ashed as a mask to remove a portion of the metal material layer 60 that are not covered by the photoresist pattern 70 being ashed in order to form a contact electrode 51 and a pixel electrode 52 respectively connected with two ends of the active layer 40 and a source/drain electrode 61 located on the contact electrode 51.

Specifically, referring to FIG. 6, in the step S4, etching the metal material layer 60 and the electrode material layer 50 using the photoresist pattern 70 as a mask in order to remove the metal material layer 60 and the electrode material layer 50 which are not blocked by the photoresist pattern 70. At the same time, removing a portion of the doped amorphous silicon layer 42 not covered by the photoresist pattern 70 in order to form the first contact layer 421 and the second contact layer 422 respectively located on two ends of the amorphous silicon material layer 41. The contact electrode 51 is connected to the first contact layer 421, and the pixel electrode 52 is connected to the second contact layer 422.

Further, in the step S4, dry etching the metal material layer 60 using the photoresist pattern 70 as a mask to remove the portion of the metal material layer 60 not covered by the photoresist pattern 70, and then wet etching the electrode material layer 50 and the doped amorphous silicon layer 42 using the photoresist pattern 70 as a mask to remove a portion of the electrode material layer 50 and the doped amorphous silicon layer 42 that are not covered by the photoresist pattern 70. In the step S4, dry etching the metal material layer 60 using the photoresist pattern 70 being ashed as a mask to remove a portion of the metal material layer 60 not covered by the photoresist pattern 70 being ashed.

Specifically, the step S4 further includes a step of removing the photoresist pattern 70 being ashed.

Figure 9:
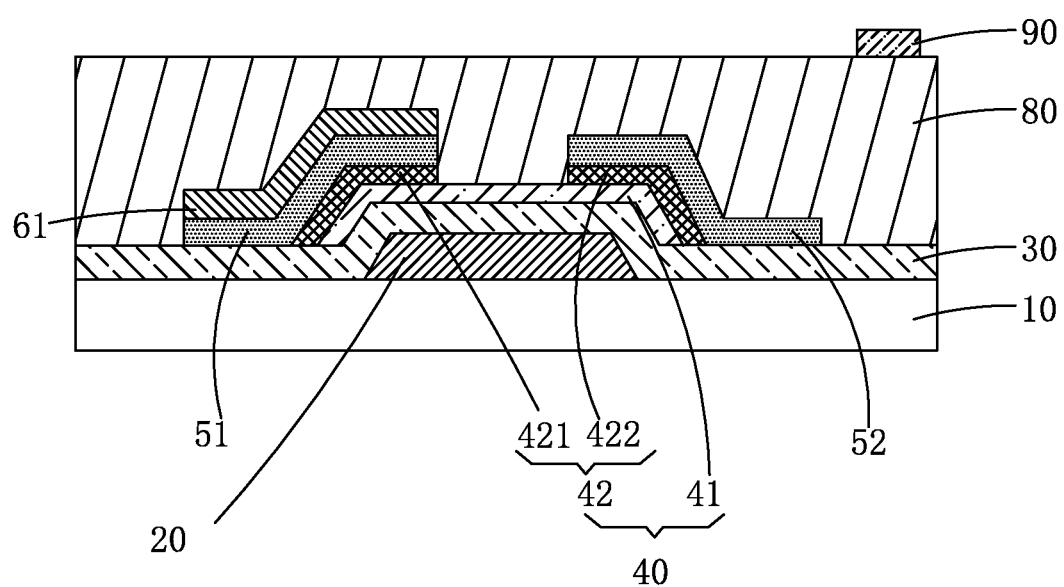
FIG. 9 is a schematic diagram of a step S5 of the manufacturing method for a TFT array substrate according to the present invention and a schematic diagram of a structure of the TFT array substrate of the present invention.

In step S5, referring to FIG. 9, depositing a passivation layer 80 on the gate insulation layer 30, the active layer 40, the pixel electrode 52, and the source/drain electrode 61. Forming the common electrode 90 on the passivation layer 80.

Specifically, the material of the common electrode 90 is preferably indium tin oxide.

It should be noted that in the manufacturing method for the TFT array substrate of the present invention, sequentially forming the electrode material layer 50 and the metal material layer 60 on the gate insulation layer 30 and the active layer 40 after forming the active layer 40 above the gate electrode 20, and forming the photoresist pattern 70 on the metal material layer 60. The photoresist pattern 70 includes the first and second photoresist blocks 71 and 72 having different thicknesses. Etching the metal material layer 60 and the electrode material layer 50 using the photoresist layer 70 in order to respectively form the connection electrode 51 and the pixel electrode 52 respectively connected to both ends of the active layer 40, and forming the source/drain electrode 61 on the connection electrode 51. The present invention can effectively reduce the contact resistance between the source/drain electrode and the active layer as comparing with the prior art that the amorphous silicon layer is directly connected to the source and drain electrodes. Accordingly, the present invention can effectively improve the quality of the product.

Furthermore, the present invention forms the active layer 40 by forming an amorphous silicon island 49 on the gate insulation layer 30 and ion-doping the amorphous silicon island 49 so that the active layer 40 has amorphous silicon material layer 41 and the amorphous silicon layer 42 being doped arranged in order. While the metal material layer 60 and the electrode material layer 50 are etched by using the photoresist pattern 70, etching the doped amorphous silicon layer 42 not covered by the photoresist pattern 70 to form a first contact layer 421 and a second contact layer 422 respectively on both ends of the amorphous silicon material layer 41. The contact electrode 51 is connected with the first contact layer 421, and the pixel electrode 52 is connected with the second contact layer 422, so as to further reduce the contact resistance between the source/drain and the active layer, comparing with the existing the technology, the present invention can complete the fabrication of the first contact layer 421 and the second contact layer 422 without modifying the active layer film forming apparatus. The process of the present invention is simple, the equipment cost is low. The production method of the TFT array substrate of the present invention can be realized by using a production line of a conventional TFT array substrate using an LTPS material.

With reference to FIG. 9, based on the same inventive concept, the present invention further provides a TFT array substrate manufactured by using the above the manufacturing method for TFT array substrate. The TFT array substrate includes a substrate 10, a gate electrode 20 disposed on the substrate 10, a gate insulation layer 30 disposed on the substrate 10 and the gate electrode 20, an active layer 40 disposed on the gate insulation layer 30 and above the gate electrode 20, and a contact electrode 51 and a pixel electrode 52 respectively connected with two terminals of the active layer 40, and a source/drain electrode 61 located on the contact electrode 51.

Specifically, referring to FIG. 9, the TFT array substrate further includes a common electrode 90 disposed on the gate insulation layer 30, the pixel electrode 52, the active layer 40, and the source/drain electrodes 61, and the passivation layer 80.

Specifically, referring to FIG. 9, the active layer 40 includes an amorphous silicon material layer 41 and a doped amorphous silicon layer 42 on the amorphous silicon material layer 41, and the doped amorphous silicon layer 42 includes a first contact layer 421 and a second contact layer 422 disposed on both ends of the amorphous silicon material layer 41. The contact electrode 51 is connected to the first contact layer 421, and the pixel electrode 52 is connected to the second contact layer 422.

Specifically, the material of the gate electrode 20 may be molybdenum.

Specifically, the material of the gate insulation layer 30 may be silicon nitride.

Specifically, the material of the contact electrode 51, the pixel electrode 52, and the common electrode 90 is preferably indium tin oxide.

It should be noted that in the TFT array substrate of the present invention, the connection electrode 51 and the pixel electrode 52 respectively connected to both ends of the active layer 40 are formed, and forming the source/drain electrode 61 on the connection electrode 51. The present invention can effectively reduce the contact resistance between the source/drain electrode and the active layer as comparing with the prior art that the amorphous silicon layer is directly connected to the source and drain electrodes. Accordingly, the present invention can effectively improve the quality of the product. Furthermore, the active layer 40 of the present invention includes an amorphous silicon material layer 41 and a doped amorphous silicon layer 42. The doped amorphous silicon layer 42 includes a first contact layer 421 located on both ends of the amorphous silicon material layer 41, and a second contact layer 422, the contact electrode 51 is connected with the first contact layer 421, and the pixel electrode 52 is connected with the second contact layer 422, so as to further reduce the contact resistance between the source/drain and the active layer.

In summary, the TFT array substrate manufacturing method of the present invention deposits an electrode material layer and a metal material layer on the gate insulation layer and the active layer in sequence after the active layer above the gate electrode is formed. A photoresist pattern is formed on the metal material layer. The photoresist pattern includes a first and second photoresist blocks with different thicknesses. The metal material layer and the electrode material layer are etched using the photoresist pattern to form a contact electrode and pixel electrodes connected with the two ends of the active layer and the source/drain electrodes on the contact electrode. The process is simple and can effectively reduce the contact resistance between the source/drain and the active layer and improve the quality of the product. The TFT array substrate of the present invention can reduce the contact resistance between the source/drain and the active layer, and has high product quality.

The above embodiments of the present invention are only exemplary; however, the present invention is not limited. The person skilled in the art can understand: without exceeding the principle and spirit of the present invention, the above embodiments can be improved, wherein the scope of the present invention is limited in the claims and the equivalents of the claims.

What is claimed is:

1. A manufacturing method for a TFT array substrate, comprising steps of:
   step (S1), providing a substrate, forming a gate electrode and a gate insulation layer covering the gate electrode on the substrate;
   step (S2), forming an active layer on the gate insulation layer, wherein the active layer comprises an amorphous silicon material layer and a doped amorphous silicon layer;
   step (S3), sequentially depositing an electrode material layer and a metal material layer on the gate insulation layer and the active layer such that the electrode material layer is in contact with the doped amorphous silicon layer; forming a photoresist pattern on the metal material layer, wherein the photoresist pattern includes a first photoresist block and a second photoresist block which are separate from each other; a projection of a portion of the first photoresist block in a vertical direction is overlapped with one end of the active layer, and a projection of a portion of the second photoresist block in the vertical direction is overlapped with an opposite end of the active layer; a thickness of the first photoresist block is greater than a thickness of the second photoresist block; and
   step (S4), etching the metal material layer and the electrode material layer using the photoresist pattern as a mask to remove a portion of the metal material layer and a portion of the electrode material layer that are not covered by the photoresist pattern; ashing the photoresist pattern to remove the second photoresist block so as to form an ashed photoresist pattern; etching the metal material layer using the ashed photoresist pattern as a mask to remove a portion of the metal material layer that is not covered by the ashed photoresist pattern in order to form a contact electrode and a pixel electrode respectively connected with the one end and the opposite end of the active layer and a source/drain electrode located on the contact electrode;
   wherein the portion of the metal material layer that is not covered by the photoresist pattern is removed with a first removing operation and the portion of the electrode material layer that is not covered by the photoresist pattern is removed with a second removing operation that is different from the first removing operation, and wherein a portion of the doped amorphous silicon layer is not covered by the photoresist pattern and corresponds to the portion of the electrode material layer that is not covered by the photoresist pattern, and the portion of the doped amorphous silicon material layer is removed simultaneously with the portion of the electrode material layer with the second removing operation, and the removal of the portion of the doped amorphous silicon layer is separate from the removal of the portion of the metal material layer that is not covered by the photoresist pattern.

2. The manufacturing method for a TFT array substrate according to claim 1, wherein the step (S4) further includes a step of removing the ashed photoresist pattern.

3. The manufacturing method for a TFT array substrate according to claim 2, wherein the method further comprises a step (S5), depositing a passivation layer on the gate insulation layer, the active layer, the pixel electrode, and the source/drain electrode; forming a common electrode on the passivation layer.

4. The manufacturing method for a TFT array substrate according to claim 1, wherein a specific process of forming the gate electrode on the substrate is: depositing a gate metal layer on the substrate, and performing an exposure and development process on the gate metal layer in order to form the gate electrode;
   wherein the step (S2) comprises:
   step (S21), depositing an amorphous silicon material on the gate insulation layer, and performing an exposure and development process to the amorphous silicon material to form an amorphous silicon island;
   step (S22), performing an ion doping to the amorphous silicon island to form the active layer, wherein the active layer includes the amorphous silicon material layer and the doped amorphous silicon layer located on the amorphous silicon material layer;
   step (S3), a specific process of forming the photoresist pattern on the metal material layer is: forming a photoresist material layer on the metal material layer, and patterning the photoresist material layer using a half-tone mask in order to obtain the photoresist pattern.

5. The manufacturing method for a TFT array substrate according to claim 4, wherein in the step (S4), when etching the metal material layer and the electrode material layer using the photoresist pattern as a mask in order to remove the metal material layer and the electrode material layer which are not blocked by the photoresist pattern, and also to remove the portion of the doped amorphous silicon layer that is not covered by the photoresist pattern in order to form a first contact layer and a second contact layer respectively located on two ends of the amorphous silicon material layer, wherein the contact electrode is connected to the first contact layer, and the pixel electrode is connected to the second contact layer.

6. The manufacturing method for a TFT array substrate according to claim 5, wherein in the step (S4), dry etching the metal material layer using the photoresist pattern as a mask to remove the portion of the metal material layer not covered by the photoresist pattern, and then wet etching the electrode material layer and the doped amorphous silicon layer using the photoresist pattern as a mask to remove the portion of the electrode material layer and the portion of the doped amorphous silicon layer that are not covered by the photoresist pattern; dry etching the metal material layer using the ashed photoresist pattern as a mask to remove the portion of the metal material layer not covered by the ashed photoresist pattern.

7. The manufacturing method for a TFT array substrate according to claim 1, wherein a material of the gate electrode is molybdenum (Mo), a material of the gate insulation layer is silicon nitride and a material of the electrode material layer is indium tin oxide (ITO).

8. The manufacturing method for a TFT array substrate according to claim 4, wherein in the step (S22), the ion doping performed to the amorphous silicon island comprises N-type ion doping.

9. The manufacturing method for a TFT array substrate according to claim 4, wherein in the step (S22), the ion doping performed to the amorphous silicon island comprises N-type ion doping with phosphorus ions.

\* \* \* \* \*